United States Patent
Kim et al.

(10) Patent No.: US 7,999,467 B2
(45) Date of Patent: Aug. 16, 2011

(54) DISPLAY DEVICE AND MANUFACTURING METHOD THEREOF FOR MINIMIZING INFLOW OF OXYGEN AND MOISTURE FROM THE OUTSIDE

(75) Inventors: Hoon Kim, Hwaseong-si (KR); Won-Hoe Koo, Seoul (KR); Jung-Mi Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 12/012,240

(22) Filed: Jan. 31, 2008

(65) Prior Publication Data
US 2009/0039780 A1    Feb. 12, 2009

(30) Foreign Application Priority Data
Aug. 8, 2007  (KR) .................. 10-2007-0079513

(51) Int. Cl.
*H01J 1/62* (2006.01)
(52) U.S. Cl. ......................... 313/512; 445/25
(58) Field of Classification Search .......... 313/498–512; 445/24–25
See application file for complete search history.

(56) References Cited

U.S. PATENT DOCUMENTS

| | | | | |
|---|---|---|---|---|
| 6,284,342 B1 * | 9/2001 | Ebisawa et al. | ............... | 428/69 |
| 6,368,730 B1 | 4/2002 | Kishimoto et al. | ............ | 428/690 |
| 6,717,052 B2 * | 4/2004 | Wang et al. | ................. | 174/381 |
| 6,798,132 B2 * | 9/2004 | Satake | ..................... | 313/495 |
| 2004/0232833 A1 | 11/2004 | Menda et al. | ............ | 313/512 |
| 2005/0248270 A1 * | 11/2005 | Ghosh et al. | ............ | 313/512 |
| 2006/0220549 A1 | 10/2006 | Kim et al. | .................. | 313/512 |
| 2006/0284556 A1 * | 12/2006 | Tremel et al. | ........... | 313/512 |
| 2007/0013292 A1 * | 1/2007 | Inoue et al. | ............... | 313/504 |

FOREIGN PATENT DOCUMENTS

| | | |
|---|---|---|
| AP | 2007-18900 | 1/2007 |
| JP | 08286181 A * | 11/1996 |
| JP | 11-176571 | 7/1999 |
| JP | 11-185956 | 7/1999 |
| JP | 2000-123971 | 4/2000 |
| JP | 2004-87357 | 3/2004 |
| JP | 2007-59311 | 3/2007 |
| KR | 2002-0079553 | 10/2002 |
| KR | 2005-0090543 | 9/2005 |
| KR | 10-0552973 | 2/2006 |
| KR | 10-0634680 | 10/2006 |
| KR | 10-0634960 | 10/2006 |
| WO | WO 2004071134 A1 * | 8/2004 |

OTHER PUBLICATIONS

Patent Abstracts of Japan, Publication No. 11-176571, Jul. 2, 1999, 1 p.
Patent Abstracts of Japan, Publication No. 11-185956, Jul. 9, 1999, 1 p.
Patent Abstracts of Japan, Publication No. 2000-123971, Apr. 28, 2000, 1 p.

(Continued)

*Primary Examiner* — Anne M Hines
(74) *Attorney, Agent, or Firm* — Innovation Counsel LLP

(57) ABSTRACT

A display device of present invention includes an insulating substrate, an array of display elements on the insulating substrate, a cover substrate opposing to the insulating substrate, a sealant formed outside the array of display elements, and a protection film formed on the cover substrate and covering the array of display elements.

15 Claims, 10 Drawing Sheets

OTHER PUBLICATIONS

Patent Abstracts of Japan, Publication No. 2004-087357, Mar. 18, 2004, 1 p.
Patent Abstracts of Japan, Publication No. 2007-018900, Jan. 25, 2007, 1 p.
Patent Abstracts of Japan, Publication No. 2007-059311, Mar. 8, 2007, 1 p.
Korean Patent Abstracts, Publication No. 1020020079553, Oct. 19, 2002, 1 p.
Korean Patent Abstracts, Publication No. 1020050090543, Sep. 14, 2005, 1 p.
Korean Patent Abstracts, Publication No. 100552973, Feb. 9, 2006, 1 p.
Korean Patent Abstracts, Publication No. 100634680, Oct. 9, 2006, 1 p.
Korean Patent Abstracts, Publication No. 100634960, Oct. 10, 2006, 1 p.

* cited by examiner

DISPLAY DEVICE AND MANUFACTURING METHOD THEREOF FOR MINIMIZING INFLOW OF OXYGEN AND MOISTURE FROM THE OUTSIDE

This application claims priority to and benefit of Korean Patent Application No. 10-2007-0079513 filed in the Korean Intellectual Property Office on Aug. 8, 2007, the entire disclosure of which is incorporated herein by reference.

BACKGROUND OF THE INVENTION (a) Field of the Invention

The present invention relates to a display device and a manufacturing method thereof, and more particularly, to a display device and its manufacturing method that can minimize inflow of oxygen and moisture from the outside.

(b) Description of Related Art

Among flat panel displays, an organic light emitting diode ("OLED") has some advantages because it is driven with a low voltage, is thin and light, has a wide viewing angle, has a relatively short response time, etc. The OLED includes a thin film transistor ("TFT") having a gate electrode, a source electrode and a drain electrode. The OLED also includes a pixel electrode connected to the TFT, a partition wall dividing the pixel electrodes from each other, an organic emission layer formed on the pixel electrode between the partition walls, and a common electrode formed on the organic emission layer.

Here, the organic emission layer is susceptible to moisture and oxygen. Therefore, the performance and the lifespan of the organic emission layer are likely to be decreased by moisture and oxygen. To prevent the organic emission layer from deteriorating, an encapsulating process is performed to make an insulating substrate having an organic emission layer face combined with a cover substrate for blocking moisture and oxygen. Further, an organic sealant is formed along an edge between the two substrates, thereby joining the two substrates together.

However, the organic sealant has a relatively high permeability to moisture (i.e., about 10 $g/m^2$ day), and the permeated moisture is likely to deteriorate the organic emission layer, thereby decreasing the lifespan and the performance of the flat panel display.

SUMMARY OF THE INVENTION

Accordingly, the present invention provides a display device and a manufacturing method that can minimize inflow of oxygen and moisture from the outside.

The foregoing aspect of the present invention can be achieved by providing a display device including an insulating substrate, an array of display elements on the insulating substrate, a cover substrate opposite the insulating substrate, a sealant formed outside the array of display elements, and a protection film formed on the cover substrate and covering the array of display elements.

Also, the foregoing aspect of the present invention can be achieved by providing a manufacturing method of a display device including preparing an insulating substrate having an array of display elements thereon, preparing a cover substrate, forming a sealant on the cover substrate, forming a protection film on the cover substrate or the insulating substrate, aligning the cover substrate and the insulating substrate with each other, pressing the cover substrate and the insulating substrate together, heating the sealant to seal the cover substrate and the insulating substrate, and annealing the protection film.

BRIEF DESCRIPTION OF THE DRAWINGS

The above and/or other aspects and advantages of the present invention will become apparent and more readily appreciated from the following description of the embodiments, taken in conjunction with the accompanying drawings of which.

Use of the same reference symbols in different figures indicates similar or identical items.

DETAILED DESCRIPTION OF EMBODIMENTS

Figure 1:
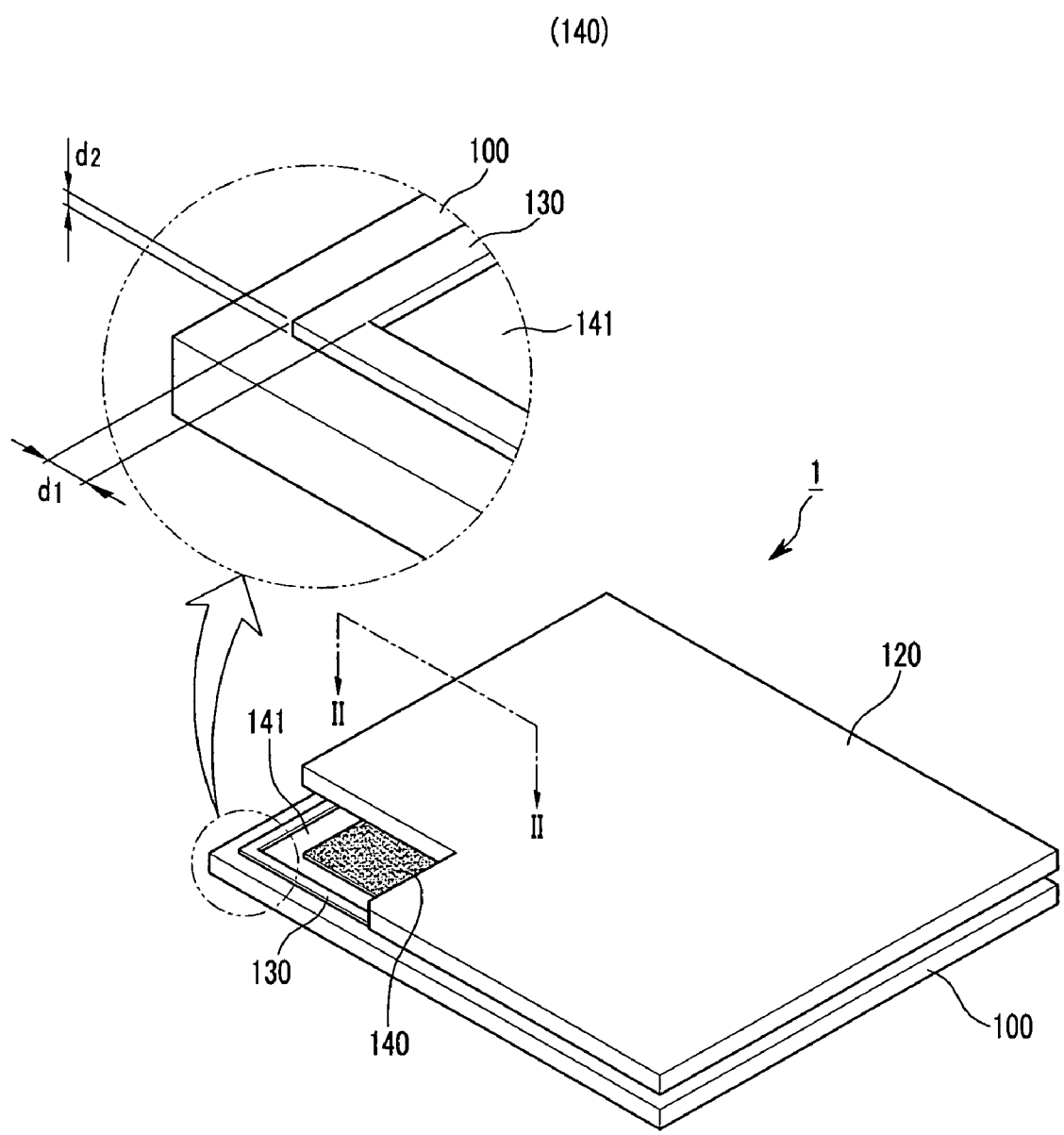
FIG. 1 illustrates a structure of a display device according to the first embodiment of the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, embodiments of the present invention will be described in more detail with reference to accompanying drawings. For example, an organic light emitting diode ("OLED") among various flat panel displays will be described below, but the present invention is not limited thereto. Alternatively, the present invention may be applied to another flat panel display such as a liquid crystal display ("LCD"), a plasma display panel ("PDP"), etc. In the following embodiments, a sealant is employed as one of various sealants, but the present invention is not limited thereto. Alternatively, any sealant can be used as long as it is hardened by heat and has a low permeability to moisture or oxygen.

Figure 2:
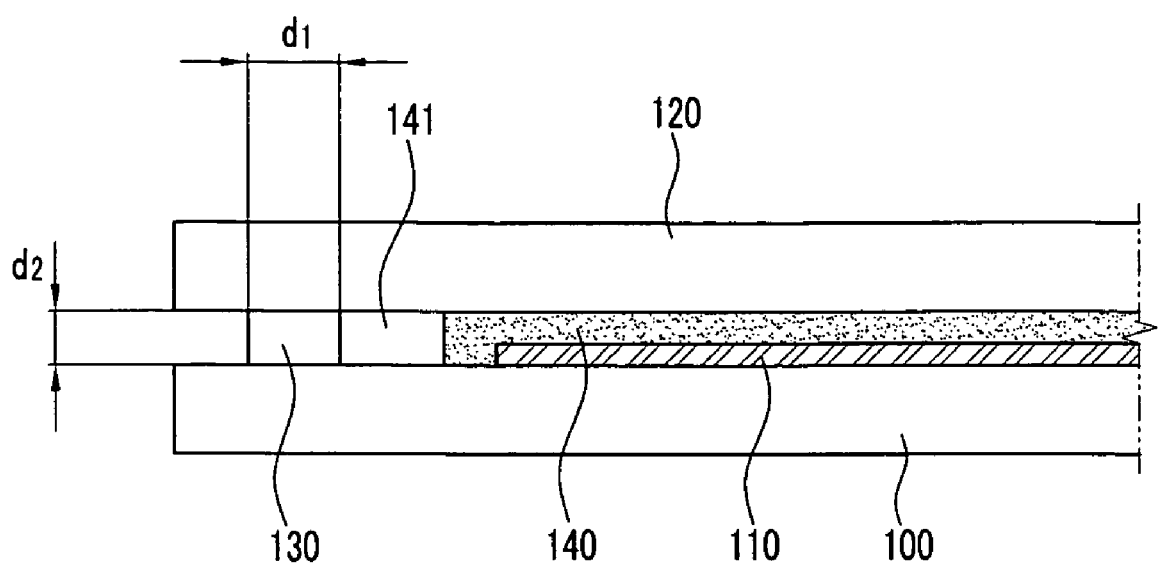
FIG. 2 illustrates a cross-section II-II of FIG. 1.

Referring to FIGS. 1 and 2, the first embodiment of the present invention will be explained.

FIG. 1 illustrates a structure of a display device according to the first embodiment of the present invention and FIG. 2 illustrates a cross-section II-II of FIG. 1.

An OLED 1 includes an insulating substrate 100 and a cover plate 120 which are encapsulated by a sealant 130. An array of display elements 110 is disposed on the insulating substrate 100 and is covered by a protection film 140 on the cover substrate 120.

The insulating substrate 100 is transparent, and may be made of glass or plastic material. Further, a barrier layer (not shown) may be formed on the insulating substrate 100, i.e., between an array of display elements 110 and the insulating substrate 100. The barrier layer prevents oxygen or moisture from being introduced into the array of display elements 110 through the insulating substrate 100, and may include SiON, $SiO_2$, $SiN_x$, $Al_2O_3$, etc. The barrier layer can be formed by a sputtering method.

The array of display elements 110 is formed by a known method, and includes an array of thin film transistors, an array of pixel electrodes, an array of walls, organic light emitting layers and common electrode. The array of display elements 110 displays optical images based on outside data.

The cover substrate 120 may be made of the same material as the insulating substrate 100 or may be made of material such as soda-lime glass, boro-silicate glass, silicate glass or lead glass.

The sealant 130 is disposed outside the area where the array of display elements 110 is. Here, the sealant 130 is used for preventing oxygen or moisture from being introduced through a gap between the insulating substrate 100 and the cover substrate 120. In one embodiment of the invention, the sealant 130 has permeability to moisture within a range of 1 $g/m^2$ day to 10 $g/m^2$ day.

According to the present and other embodiments, a sealant material including a frit is employed as the sealant 130, but not limited thereto. Alternatively, any sealant material can be employed as long as it is hardened by heat and has a very low permeability to moisture or oxygen In one embodiment of the invention, the sealant 130 has a width d1 of 0.1 mm to 5 mm, and a thickness d2 of 1 μm to 200 μm.

In this embodiment of the invention, if the width d1 of the sealant 130 is smaller than 0.1 mm, then a joining strength between the two substrates 100 and 120 would deteriorate and be defective. It would also be difficult to apply a dispensing method or a screen-printing method to form the sealant 130 if the width d1 of the sealant 130 is smaller than 0.1 mm.

On the other hand, if the width d1 of the sealant 130 is larger than 5 mm, then a marginal area for accommodating the sealant 130 would be too large to get a compact design.

However, other embodiments of the invention include a width d1 smaller than 0.1 mm or a width d1 larger than 5 mm.

Meanwhile, if the thickness d2 of the sealant 130 is smaller than 1 μm, then it would be difficult to apply the dispensing method or the screen-printing method to form the sealant 130 and the defective joining may arise.

On the other hand, if the thickness d2 of the sealant 130 is larger than 200 μm, it would be difficult to get a compact design.

However, other embodiments of the invention include a thickness d2 smaller than 1 μm or a thickness d2 larger than 200 μm.

In one embodiment of the invention, the sealant 130 has a width d1 of 1 mm through 2 mm, and a thickness d2 of 100 μm through 600 μm. Here, the width d1 and the thickness d2 of the sealant 130 can increase or decrease in proportion to the size of the display device.

The sealant 130 may include a frit, such an adhesive powdered glass made of a material such as $SiO_2$, $TiO_2$, PbO, $PbTiO_3$, $Al_2O_3$, etc. Such a sealant 130 has a very low permeability to moisture and oxygen, so that the organic emission layer in the display element 110 is prevented from deteriorating. Further, the sealant 130 has a sufficient durability to endure vacuum mounting, so that the OLED 1 can be fabricated in a vacuum chamber, thereby minimizing the permeability of oxygen and moisture from the outside. Thus, the lifespan of the flat panel display increases and the performance thereof is improved. Here, the sealant 130 is thermosetting, but the present invention is not limited thereto. Alternatively, the sealant 130 may be thermoplastic. The sealant 130 may be hardened at a high temperature.

The protection film 140 is disposed between the insulting substrate 100 and cover substrate 120. The protection film 140 is attached to the cover substrate 120 by a lamination process. The protection film 140 joins the two substrates 100 and 120 together and protects the display elements 110 from moisture and oxidation.

The protection film 140 is made of an adhesive material and covers the display elements 100.

The adhesive material includes a mixture of ionomer and metal or metal hydride, but is not limited thereto.

Referring to the FIGS. 3a through 3d, an exemplary method for manufacturing the display device aforementioned will be explained.

Figure 3A:
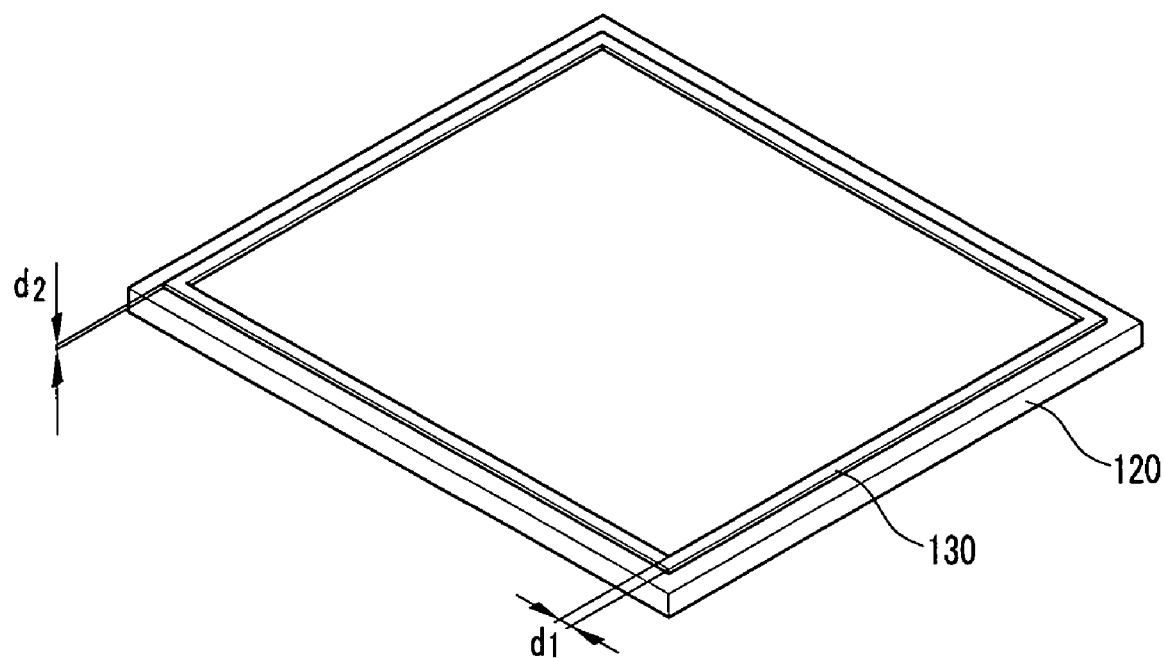
FIG. 3a illustrates a step of forming a sealant on the cover substrate according to an exemplary method of manufacturing the display device of the first embodiment.

As shown in FIG. 3a, the sealant 130 is formed along the edge portion of the cover substrate 120. Material for the sealant 130 is deposited on the cover substrate 120 by a dispensing method, screen printing method, or roll printing method, and then is baked for hardening.

Figure 3B:
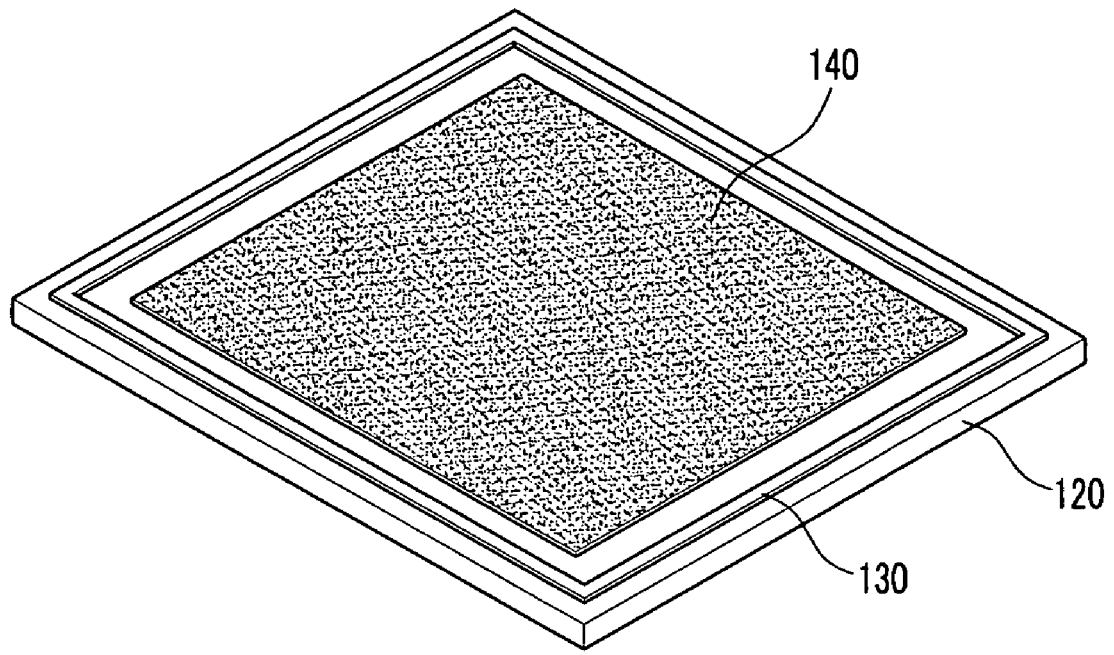
FIG. 3b illustrates a step of forming a protection film on the cover substrate according to an exemplary method of manufacturing the display device of the first embodiment.

Next, as shown by FIG. 3b, the protection film 140 is formed on the cover plate 120. The protection film 140 is deposited by a film lamination process with a thickness of below 50 μm, preferably 5-30 μm. To simplify the Lamination process, pre-heating process of the cover substrate 120 of the protection film 140 may be performed. Although the protection film 140 is formed on the cover substrate 120 in FIG. 3b, the protection film 140 may be formed on the insulating substrate 100.

Figure 3C:
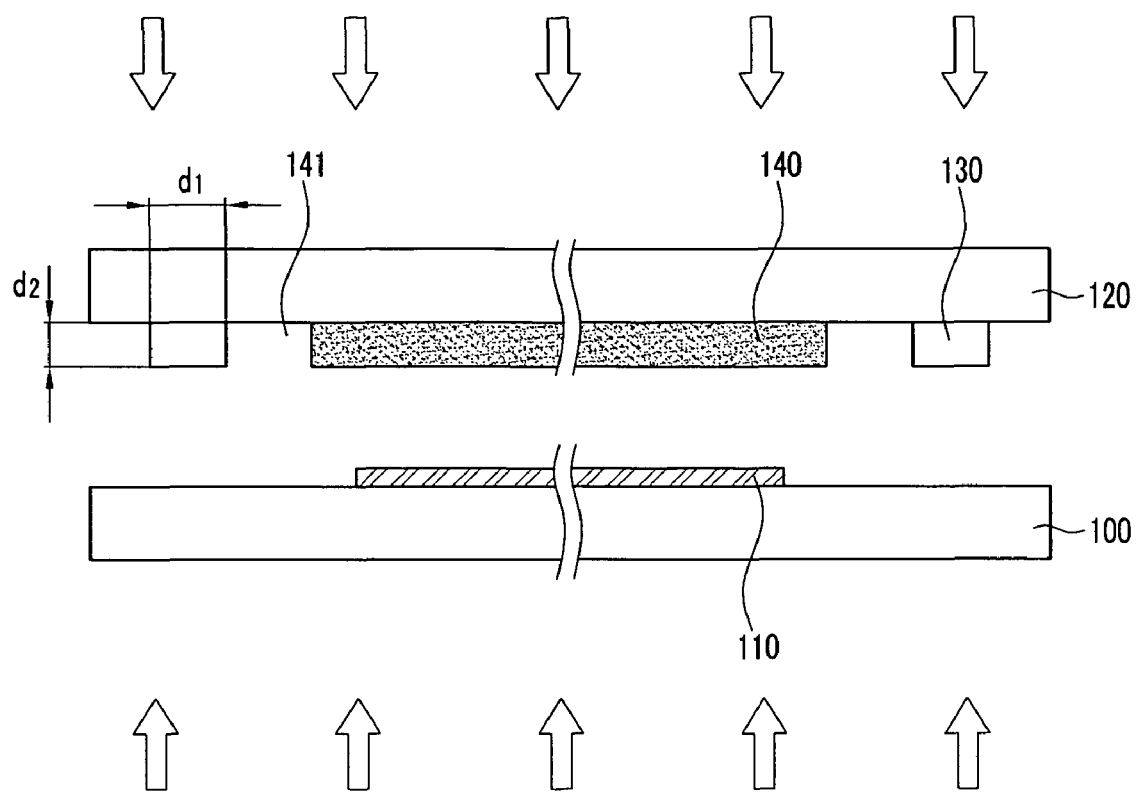
FIG. 3c illustrates a step of aligning the cover substrate and the insulating substrate according to an exemplary method of manufacturing the display device of the first embodiment.

Next, as shown in FIG. 3c, the insulating substrate 100 and the cover substrate 120 are aligned with each other and then the two substrates 100 and 120 are pressed to contact each other. At this time in one embodiment of the invention, the protection film 140 uniformly covers the display elements 110. After that, the sealant 130 is heated by laser radiation to seal the two substrates 100 and 120.

Figure 3D:
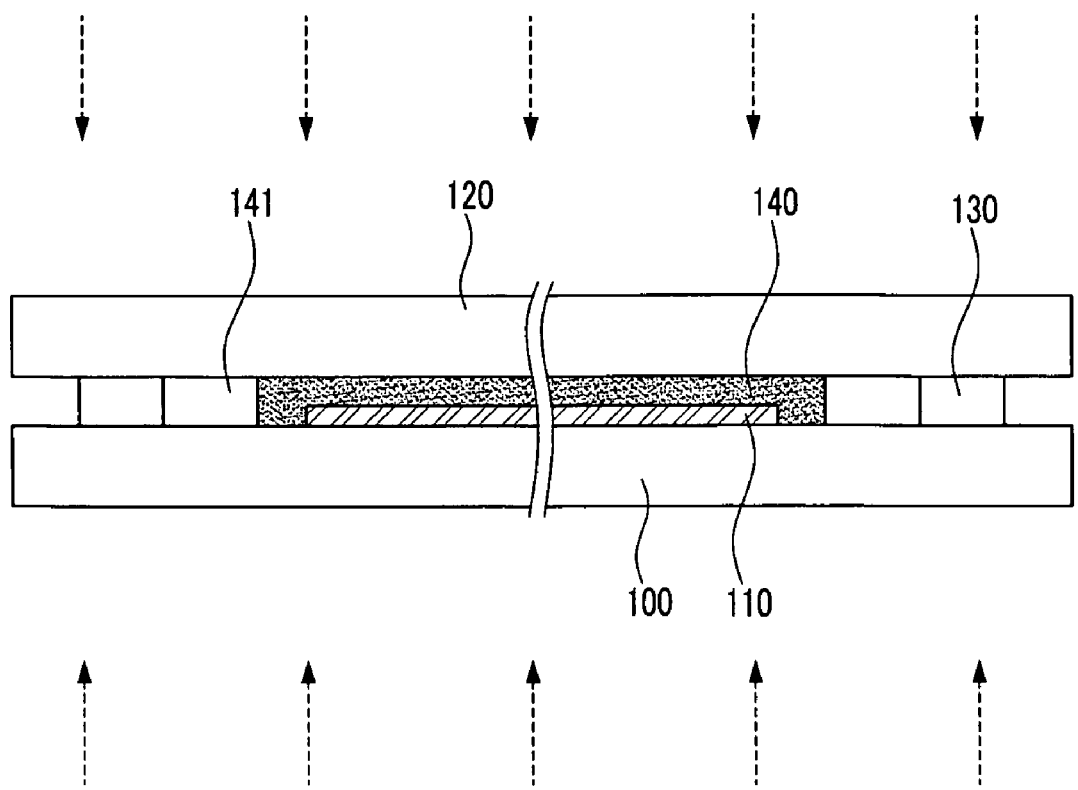
FIG. 3d illustrates a step of sealing the cover substrate and the insulating substrate according to an exemplary method of manufacturing the display device of the first embodiment.

Next, as shown in FIG. 3d, the sealed substrates 100 and 120 are heated at a temperature under 150° C., and the protection film 140 becomes more transparent and thinner. Therefore, the present invention can be applied to a top emission type OLED where lights are emitted through the protection film 140 and the cover substrate 120.

According to the exemplary embodiment explained above, it can be possible to get a display device that can minimize inflow of oxygen and moisture from the outside with film lamination process.

Compared to the case of depositing an organic layer of epoxy on the display elements through a screen printing method, the manufacturing process can be simplified in using a film lamination process because a film having a predetermined size can be used in the lamination process. Also, it is easy to cope with the situation of changing a model size only by applying a different size film.

Next, other embodiments of the present invention will be explained below with reference with FIGS. 4a through 5b. In explaining these embodiments, the explanation is mainly focused on the distinctive features of the embodiments compared to the first embodiment.

Figure 4A:
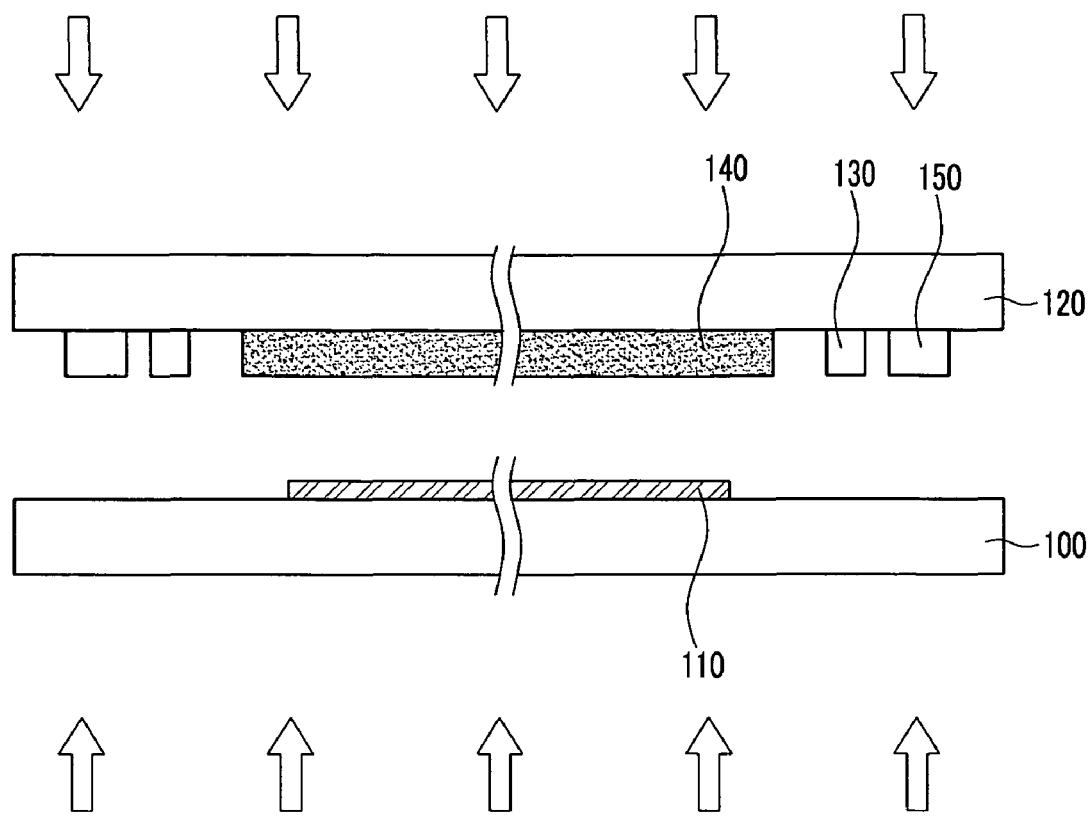
FIG. 4a illustrates a step of aligning the cover substrate and the insulating substrate according to an exemplary method of manufacturing the display device of the second embodiment.
Figure 4B:
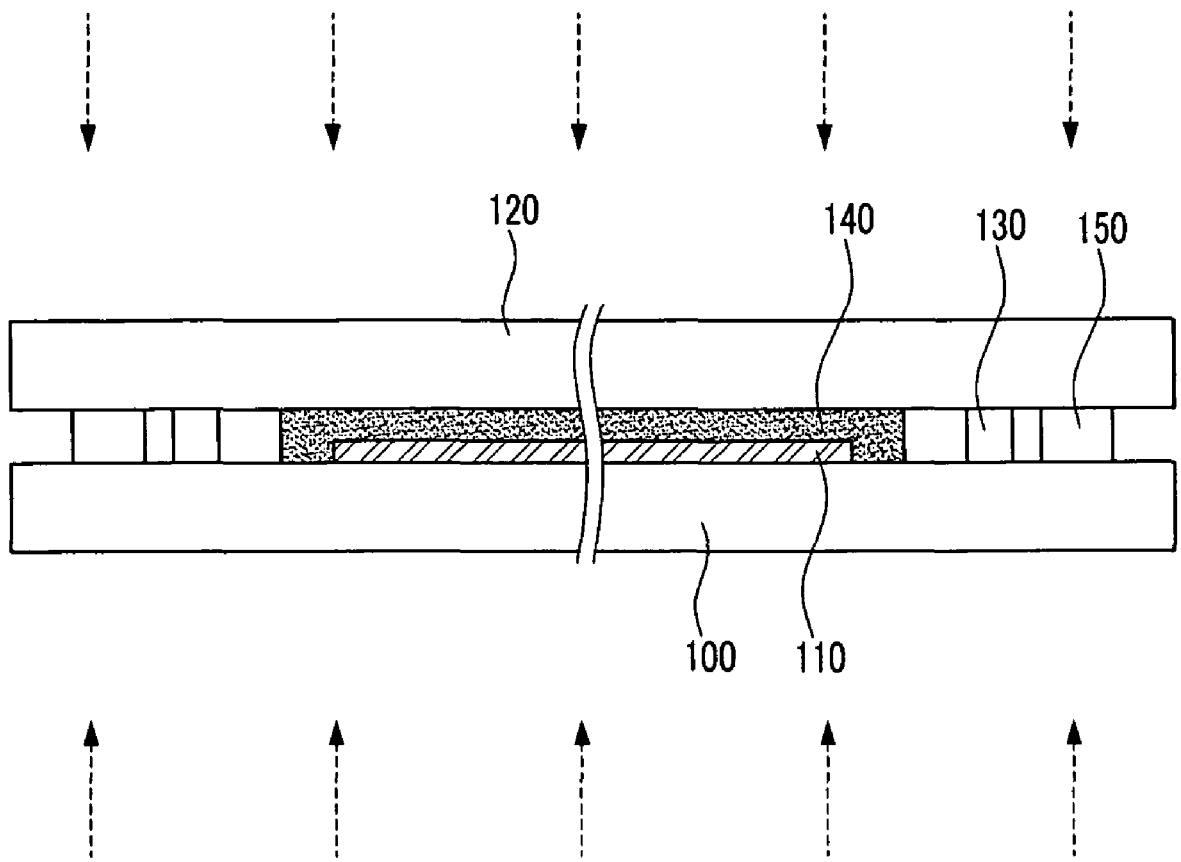
FIG. 4b illustrates a step of sealing the cover substrate and the insulating substrate according to an exemplary method of manufacturing the display device of the second embodiment.

Referring to FIGS. 4a and 4b, the second embodiment of the present invention will be explained. A distinctive feature of this embodiment is an auxiliary sealant 150 outside the sealant 130.

After forming the sealant 130 and the protection film 140 on the cover substrate 120 as explained with FIG. 3b, the auxiliary sealant 150 made of epoxy resin et al. is formed on the cover substrate 120.

Next, as shown in FIG. 4a, the substrates 100 and 120 are joined together in a vacuum state. In this embodiment of the invention the vacuum is around 300 torr.

The auxiliary sealant 150 is cured by UV radiation. The pressure is then adjusted to atmospheric pressure to press the substrates 100 and 120 together creating a tight bond. After that, the sealant 130 is heated by laser radiation to seal the two substrates 100 and 120.

Next, as shown in FIG. 4b, the sealed substrates 100 and 120 are heated at a temperature of 150° C., and the protection film 140 becomes more transparent and thinner. Therefore, the present invention can be applied to a top emission type OLED where lights are emitted through the protection film 140 and the cover substrate 120.

In this embodiment, bonding by the auxiliary sealant 150 precedes sealing by the sealant 130, so procedural degree of freedom can increase. Once the substrates 100 and 120 are bonded by the auxiliary sealant 130, the display elements are protected from the inflow of oxygen and moisture from the outside for a time. Therefore, subsequent process such as a sealing process by laser annealing can be performed under atmospheric pressure, not necessarily under a vacuum state.

Referring FIGS. 5a and b, the third embodiment of the present invention will be explained. Distinctive features of this embodiment are a desiccant 160 inside the sealant 130.

In addition to the sealant 130, the desiccant 160 can protect the display elements 110 from the inflow of oxygen and moisture.

The desiccant 160 may include Barium (Ba) or Calcium (Ca).

After forming the sealant 130, the protection film 140 and the auxiliary sealant 150 on the cover substrate 120 as explained with respect to FIG. 4b, the desiccant 160 is formed on the cover substrate 120 using a dispensing method or screen printing method.

Figure 5A:
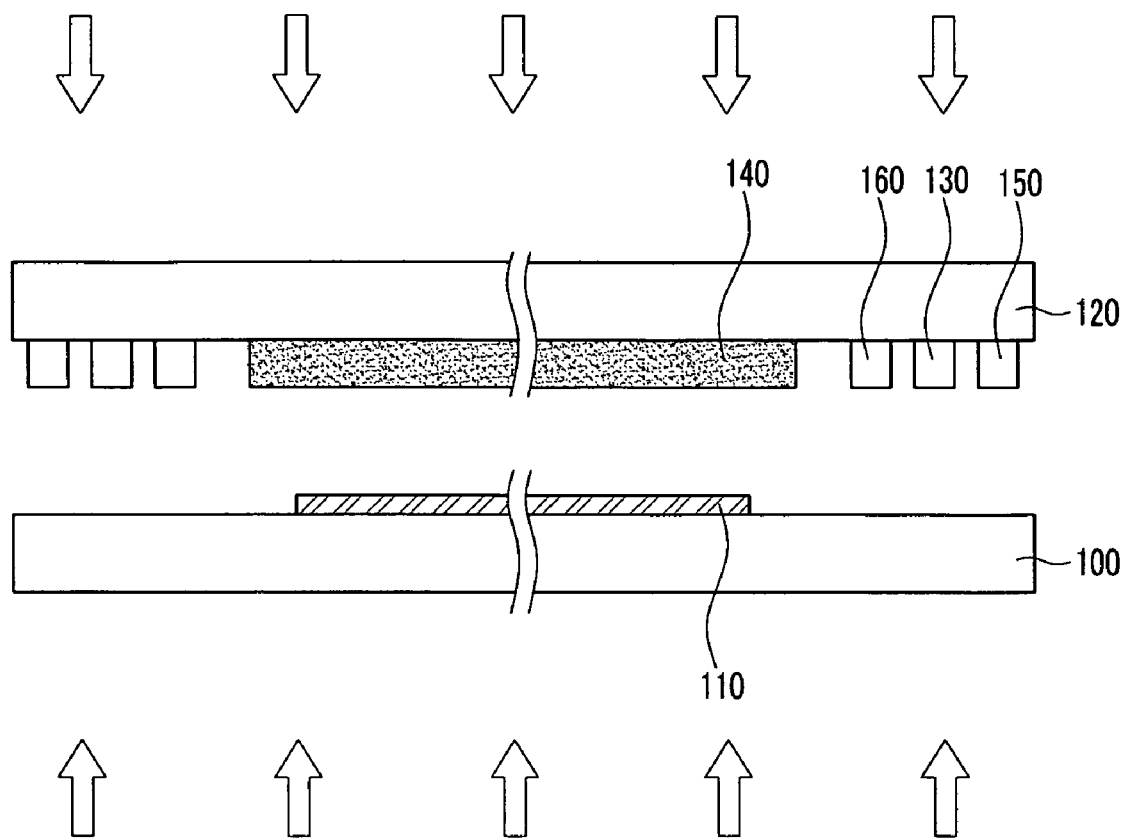
FIG. 5a illustrates a step of aligning the cover substrate and the insulating substrate according to an exemplary method of manufacturing the display device of the third embodiment.

Next, as shown in FIG. 5a, the substrates 100 and 120 are joined together in a vacuum. In one embodiment of the invention the vacuum is around 300 torr. The auxiliary sealant 150 is cured by UV radiation. The pressure is then adjusted to atmospheric pressure to press the substrates 100 and 120 together creating a tight bond. After that, the sealant 130 is heated by laser radiation to seal the two substrates 100 and 120.

Figure 5B:
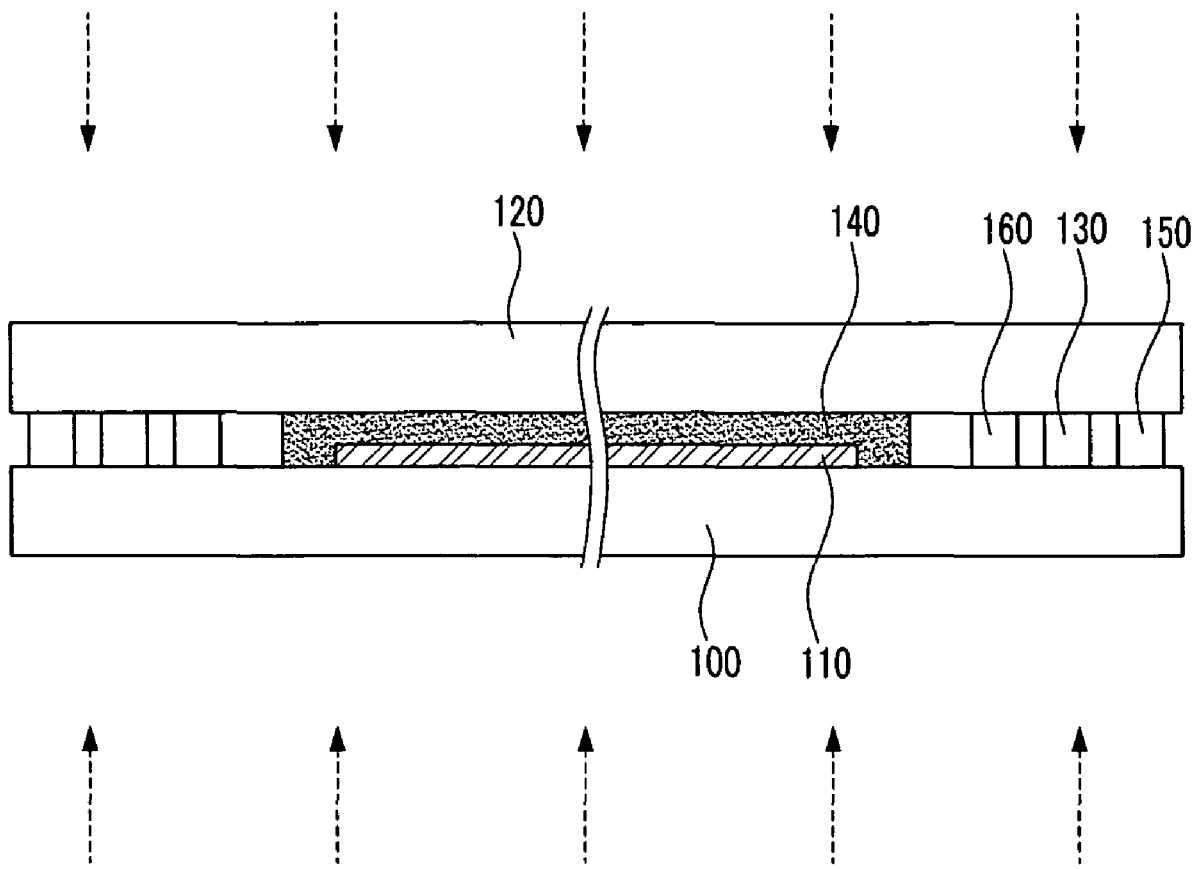
FIG. 5b illustrates a step of sealing the cover substrate and the insulating substrate according to an exemplary method of manufacturing the display device of the third embodiment.

Next, as shown in FIG. 5b, the sealed substrates 100 and 120 are heated at a temperature of about 150° C., and the protection film 140 becomes more transparent and thinner.

In this embodiment, as the desiccant 160 is provided inside the sealant 130, the display elements 110 can be surely protected from the inflow of oxygen and moisture from outside.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
   an insulating substrate;
   an array of display elements disposed on the insulating substrate and comprising an upper surface and a sidewall;
   a cover substrate opposing the insulating substrate;
   a sealant located outside the array of display elements;
   a protection film located on the cover substrate and covering the array of display elements; and
   an auxiliary sealant outside the sealant,
   wherein the protection film contacts the upper surface and the sidewall of the array of display elements,
   wherein the auxiliary sealant and the sealant contact the same surface of the cover substrate.

2. A display device of claim 1, wherein the protection film includes a mixture of ionomer and one of metal and metal hydride.

3. A display device of claim 1, wherein the protection film is formed on the cover substrate by a film lamination method.

4. A display device of claim 1, wherein the sealant includes frit.

5. A display device of claim 1, further comprising a desiccant inside the sealant.

6. A display device of claim 5, wherein the desiccant includes at least one of the Barium and Calcium.

7. A display device of claim 1, wherein the array of display elements includes organic light emitting elements.

8. A display device of claim 7, wherein the array of display elements includes top emission type organic light emitting elements.

9. A manufacturing method of a display device, the method comprising:
   preparing an insulating substrate having an array of display elements thereon;
   preparing a cover substrate;
   forming an auxiliary sealant on the cover substrate;
   forming a sealant on the cover substrate;
   forming a protection film on the cover substrate or the insulating substrate;
   aligning the cover substrate and the insulating substrate with each other;
   pressing the cover substrate and the insulating substrate to contact each other and
   curing the auxiliary sealant and heating the sealant to seal the cover substrate and the insulating substrate,
   wherein the array of display elements has an upper surface and a sidewall, and
   wherein the protection film contacts the upper surface and the sidewall of the array of display elements,
   wherein curing the auxiliary sealant is performed before heating the sealant.

10. The method of claim 9, wherein the protection film is formed by a film lamination method.

11. The method of claim 9, wherein the auxiliary sealant is formed by a dispensing method, screen printing method, slit coating method or roll printing method.

12. The method of claim 9, further comprising annealing the protection film.

13. The method of claim 12, wherein the heating of the sealant is performed by a laser.

14. The method of claim 9, further comprising forming a desiccant on the cover substrate.

15. The method of claim 9, further comprising heating the cover substrate before forming the protection film on the cover substrate.

* * * * *